United States Patent
Chan et al.

(10) Patent No.: US 10,236,384 B2
(45) Date of Patent: Mar. 19, 2019

(54) FORMATION OF FINFET JUNCTION

(71) Applicant: International Business Machines Corporation, Armonk, NY (US)

(72) Inventors: Kevin K. Chan, Staten Island, NY (US); Pouya Hashemi, White Plains, NY (US); Ali Khakifirooz, Los Altos, CA (US); John A. Ott, Greenwood Lake, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/835,849

(22) Filed: Dec. 8, 2017

(65) Prior Publication Data

US 2018/0108778 A1 Apr. 19, 2018

Related U.S. Application Data

(60) Continuation of application No. 15/166,665, filed on May 27, 2016, now Pat. No. 9,865,737, which is a division of application No. 14/639,163, filed on Mar. 5, 2015, now Pat. No. 9,406,529.

(51) Int. Cl.
| | | |
|---|---|---|
| H01L 29/78 | (2006.01) | |
| H01L 29/66 | (2006.01) | |
| H01L 21/324 | (2006.01) | |
| H01L 29/161 | (2006.01) | |
| H01L 29/167 | (2006.01) | |
| H01L 29/10 | (2006.01) | |
| H01L 21/84 | (2006.01) | |
| H01L 27/092 | (2006.01) | |
| H01L 29/165 | (2006.01) | |

(52) U.S. Cl.
CPC ........ *H01L 29/7851* (2013.01); *H01L 21/324* (2013.01); *H01L 21/845* (2013.01); *H01L 27/0924* (2013.01); *H01L 29/1033* (2013.01); *H01L 29/161* (2013.01); *H01L 29/165* (2013.01); *H01L 29/167* (2013.01); *H01L 29/66545* (2013.01); *H01L 29/66795* (2013.01); *H01L 29/785* (2013.01); *H01L 29/7848* (2013.01)

(58) Field of Classification Search
CPC .................................................... H01L 21/845
See application file for complete search history.

(56) References Cited

U.S. PATENT DOCUMENTS

| | | | |
|---|---|---|---|
| 7,851,790 B2 | 12/2010 | Rachmady et al. | |
| 7,915,693 B2 | 3/2011 | Okano | |
| 7,993,999 B2 | 8/2011 | Basker et al. | |
| 8,110,458 B2 | 2/2012 | Jin et al. | |

(Continued)

OTHER PUBLICATIONS

IBM, List of IBM Patents or Patent Applications Treated as Related, Appendix P, dated Dec. 21, 2017, 2 pages.

(Continued)

*Primary Examiner* — Eugene Lee
(74) *Attorney, Agent, or Firm* — Erik K. Johnson

(57) ABSTRACT

A finFET structure, and method of forming such structure, in which a germanium enriched nanowire is located in the channel region of the FET, while simultaneously having silicon-germanium fin in the source/drain region of the finFET.

13 Claims, 7 Drawing Sheets

(56) References Cited

U.S. PATENT DOCUMENTS

| | | |
|---|---|---|
| 8,395,195 B2 | 3/2013 | Chang et al. |
| 8,399,314 B2 | 3/2013 | Cohen et al. |
| 8,513,073 B1 | 8/2013 | Basker et al. |
| 8,574,981 B2 | 11/2013 | Flachowsky et al. |
| 9,054,194 B2 | 6/2015 | Tung et al. |
| 9,406,529 B1 | 8/2016 | Chan et al. |
| 9,543,438 B2 | 1/2017 | Tsai et al. |
| 9,984,940 B1 * | 5/2018 | Chu ............ H01L 21/845 |
| 2005/0186742 A1 | 8/2005 | Oh et al. |
| 2006/0175669 A1 | 8/2006 | Kim et al. |
| 2012/0104472 A1 | 5/2012 | Xu et al. |
| 2013/0009245 A1 | 1/2013 | Tsai et al. |
| 2014/0252475 A1 | 9/2014 | Xu |
| 2014/0273379 A1 | 9/2014 | Tsai et al. |
| 2015/0270345 A1 | 9/2015 | Hwang et al. |
| 2015/0279973 A1 | 10/2015 | Akarvardar et al. |
| 2015/0287614 A1 | 10/2015 | Cheng et al. |
| 2015/0303281 A1 | 10/2015 | Fogel et al. |
| 2015/0311286 A1 | 10/2015 | Lee et al. |
| 2015/0318169 A1 | 11/2015 | Qi et al. |
| 2016/0087070 A1 | 3/2016 | Machkaoutsan et al. |
| 2016/0276483 A1 | 9/2016 | Chan et al. |
| 2017/0256645 A1 * | 9/2017 | Chung ............ H01L 21/823807 |

OTHER PUBLICATIONS

Chan et al., "Formation of FinFET Junction," U.S. Appl. No. 14/639,163, filed Mar. 5, 2015.

List of IBM Patents or Patent Applications Treated as Related, May 27, 2016, 2 pgs.

Takagi et al., "Mobility-Enhanced CMOS Technologies Using Strained Si/SiGe/Ge Channels", ICICDT06, 2006 IEEE, 2 pages.

Jiang et al., "Ge-Rich (70%) SiGe Nanowire MOSFET Fabricated Using Pattern-Dependent Ge-Condensation Technique", IEEE Electron Device Letters, vol. 29, No. 6, Jun. 2008, pp. 595-598.

\* cited by examiner

US 10,236,384 B2

FORMATION OF FINFET JUNCTION

BACKGROUND

The present invention relates to semiconductor devices, and particularly to forming source/drain regions, and forming abrupt Fin Field Effect Transistor (FinFET) junctions.

Field effect transistors (FETs) are commonly employed in electronic circuit applications. FETs may include a source region and a drain region spaced apart by a semiconductor channel region. A gate, potentially including a gate dielectric layer, a work function metal layer, and a metal electrode, may be formed above the channel region. By applying voltage to the gate, the conductivity of the channel region may increase and allow current to flow from the source region to the drain region.

FinFETs are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

In some FinFET structures, different materials may be used for the fins of pFinFETs and nFinFETs in order to improve device performance. However, a material that may improve pFinFET performance may reduce nFET performance, and vice versa. For example, while pFinFET performance may be improved by forming fins made of silicon-germanium, nFinFET performance may instead be improved by forming fins made of undoped or carbon-doped silicon and may be degraded by forming fins made of silicon-germanium. Further, pFinFETs and nFinFETs are often fabricated on the same substrate.

BRIEF SUMMARY

An embodiment of the invention may include a method for forming a finFET structure. The finFET structure contains a silicon germanium fin having a source/drain region and a channel region, an epitaxial layer located on the source/drain region of the silicon germanium fin, a dummy gate located above the channel region of the silicon germanium fin, and a spacer located between the dummy gate and the epitaxial layer and above the source/drain region of the fin. The dummy gate is removed. A thermal condensation is performed on an exterior portion of the silicon germanium fin in the channel region. The thermal condensation forms a silicon oxide layer on the exterior portion of the silicon germanium fin in the channel region and an enriched germanium fin on an interior portion of the silicon germanium fin in the channel region. The silicon oxide layer is removed from the exterior portion of the silicon germanium fin.

An additional embodiment of the invention may include a semiconductor structure containing a fin. The fin contains a source/drain region and a channel region. A portion of the fin in the source/drain region is silicon germanium, and the portion of the fin in the channel region contains a higher concentration of germanium than the source drain region. An epitaxial layer may be located above the source/drain region. A spacer layer may be located above the source/drain region and adjacent to the epitaxial layer, wherein the surface of the spacer layer opposite the epitaxial layer abuts the channel region.

An additional embodiment of the invention may include a semiconductor structure containing a fin. The fin contains a source/drain region and a channel region. A portion of the fin in the source/drain region is silicon germanium, and the cross-sectional area of the portion of the fin in the source/drain region is greater than the cross-sectional area of the portion of the fin in the channel region. An epitaxial layer may be located above the source/drain region. A spacer layer may be located above the source/drain region and adjacent to the epitaxial layer, wherein the surface of the spacer layer opposite the epitaxial layer abuts the channel region.

BRIEF DESCRIPTION OF THE SEVERAL DRAWINGS

Figure 1A:
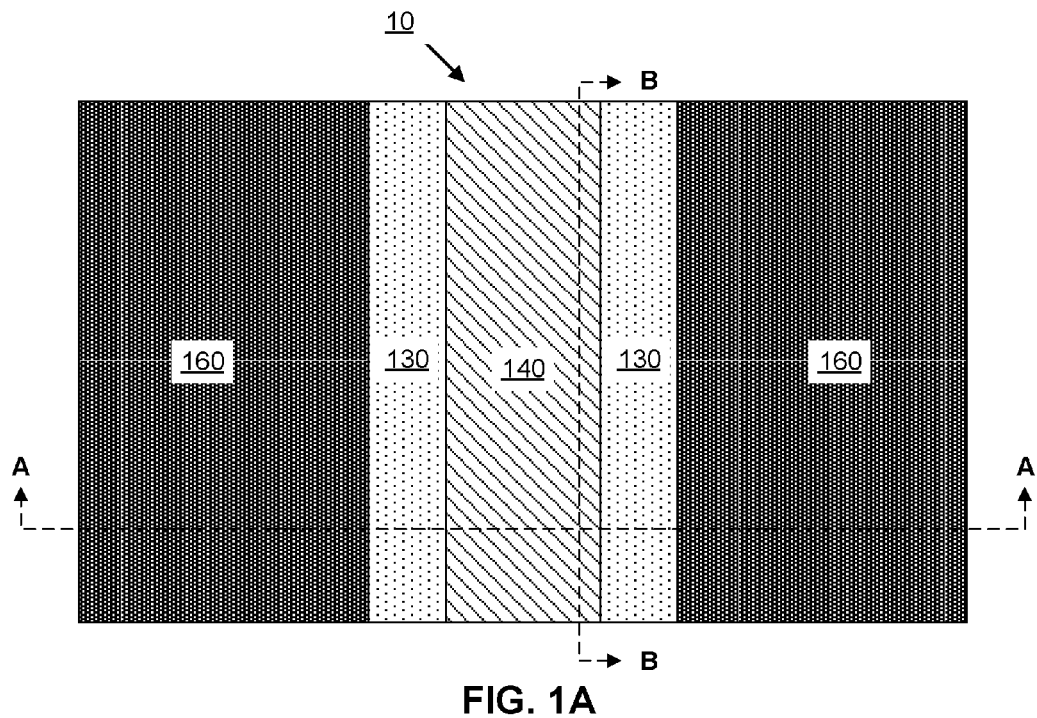
FIG. 1a is a top view of a FinFET device with a dummy gate, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the inven-

DETAILED DESCRIPTION

Example embodiments now will be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Forming FinFET devices where the channel region and source/drain region of the fin have different material properties may allow for independently tuning each region, which may increase the resulting device performance of the overall structure. Manipulation of the channel region may be performed in order to change the characteristics of the material used, and improve the overall characteristics of the device. Such a strategy may be performed following the removal of a dummy gate during the manufacturing of a replacement metal gate, and use a technique such as thermal condensation to drive silicon out of a channel region of the FinFET device, thereby increasing the germanium concentration in the channel region of a silicon germanium fin.

Figure 1B:
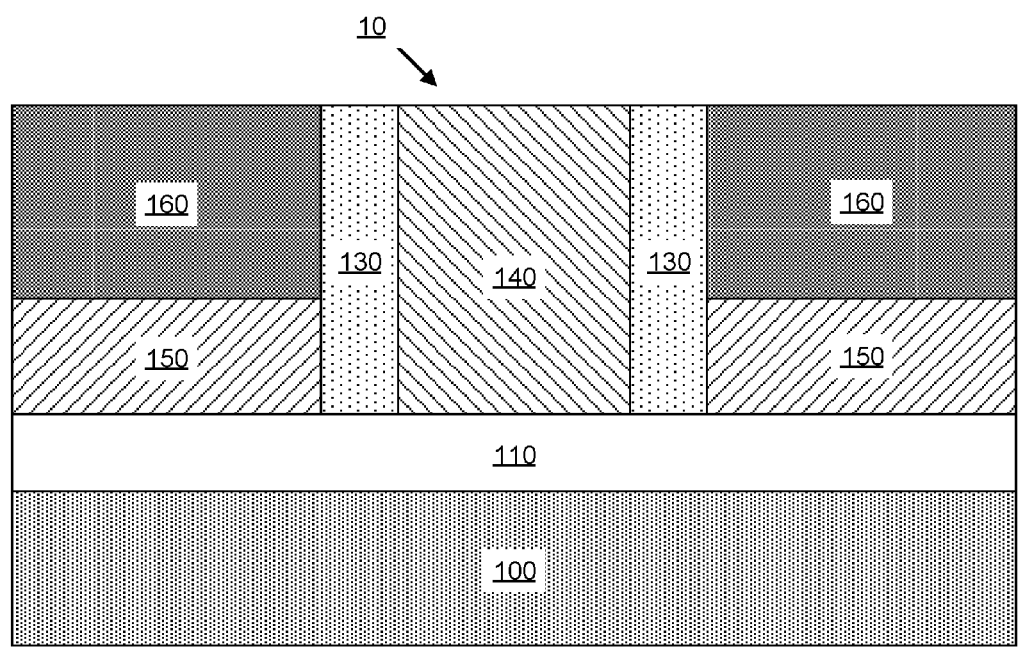
FIG. 1b is a cross sectional view along a-a of FIG. 1a of a FinFET device with a dummy gate, according to an example embodiment.
Figure 1C:
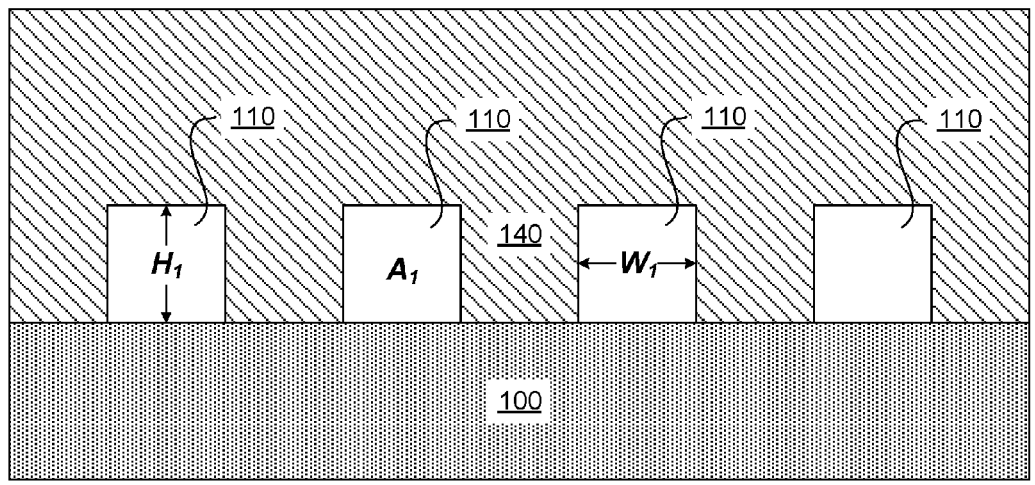
FIG. 1c is a cross sectional view along b-b of FIG. 1a of a FinFET device with a dummy gate, according to an example embodiment.

Referring to FIGS. 1A-1C, a dummy gate 10 may be located above a substrate 100. The dummy gate 10 may contain a fin 110 located above a substrate 100. The fin 110 may have a width, $W_1$, ranging from approximately 2 nm to approximately 40 nm, preferably approximately 4 nm to approximately 20 nm; a height, $H_1$, ranging from approximately 5 nm to approximately 300 nm, preferably approximately 10 nm to approximately 80 nm; and a cross-sectional area, $A_1$, ranging from approximately 10 nm$^2$ to approximately 12000 nm$^2$, preferably approximately 40 nm$^2$ to approximately 1600 nm$^2$. The fin 110 may be formed, for example by removing material from the substrate 100 using a photolithography process followed by an anisotropic etching process such as reactive ion etching (RIE) or plasma etching. Other methods of forming fins known in the art may also be utilized, such as sidewall image transfer (SIT).

In some embodiments, the substrate 100 may be a semiconductor on insulator (SOI) substrate. In embodiments where the substrate 100 is an SOI substrate, the fins 110 may be formed from a top semiconductor layer separated from a base semiconductor substrate by a buried insulator layer (not shown). In such embodiments, the top semiconductor layer and the base semiconductor substrate may be made be made of any semiconductor material typically known in the art, including, for example, silicon, germanium, silicon-germanium alloy, silicon carbide, silicon-germanium carbide alloy, and compound (e.g. II-VI) semiconductor materials. In such embodiments, the fin 110 may be electrically insulated from other structures formed on the device by removing the semiconductor material adjacent to the fin. The buried insulator layer may have a thickness ranging from approximately 20 to approximately 500 nm, preferably about 150 nm. In such embodiments, the fin 110 may rest on the buried insulator layer, separated from the base semiconductor substrate. In a preferred embodiment, the fin 110 may be silicon germanium, having a formula of $Si_{1-x}Ge_x$, whereby the concentration of germanium, x, may be from about 0.2 to about 0.5.

Still referring to FIGS. 1A-1C, a dummy gate 10 may be located above the substrate 100, and cross over a channel region of the fin 110. The dummy gate 10 may be substantially perpendicular to the fin 110, where the fin 110 passes through the dummy gate 10 in a gate region, and a source/drain region of the fin 110 may be located on both sides of the gate region. The dummy gate 10 may have a height of approximately 40 nm to approximately 200 nm, preferably approximately 50 nm to approximately 150 nm. The dummy gate 10 may include a sacrificial gate structure 140, which may include a dummy gate dielectric (not shown), a dummy gate material (not shown) and a hardmask (not shown), that may be later removed and replaced by a replacement gate dielectric, WF metal and a replacement gate electrode. In an example embodiment, the dummy gate material may be made of a polysilicon material. In an example embodiment, the dummy gate dielectric (e.g., silicon oxide) formed using known deposition techniques known in the art, including, for example, ALD, CVD, PVD, MBD, PLD, LSMCD, sputtering, and plating. In some embodiments, the hardmask may be made of an insulating material, such as, for example, silicon nitride or silicon oxide, capable of protecting the sacrificial gate structure 140 during subsequent processing steps. Further, while only a single dummy gate 10 is shown, some embodiments may include more than one gate above the fin 110.

Still referring to FIGS. 1A-1C, a spacer 130 may be formed adjacent to the exposed vertical surfaces of the sacrificial gate structure 140, and cover a portion of the substrate 100 and the fin 110. The spacer 130 may be made of any suitable insulating material, such as silicon nitride, silicon oxide, silicon oxynitrides, or a combination thereof, and may have a thickness ranging from 2 nm to approximately 100 nm. The spacer 130 may be formed by any method known in the art, including depositing a conformal insulating layer over the gate structure 120 and anisotropically etching the material from the horizontal surfaces. Further, in various embodiments, the spacer 130 may include one or more layers.

Still referring to FIGS. 1A-1C, a source/drain epitaxy 150 is grown on a source/drain region of the fin 110. The source/drain epitaxy 150 may include a semiconductor material epitaxially grown on the fin. In some embodiments, a semiconductor material may be epitaxially grown on the existing crystal lattice of the fin 110. In an example embodiment, the semiconductor material may be silicon-germanium. In such an embodiment, the semiconductor material may contain, for example, approximately 20% to approximately 100% germanium, approximately 0% to approximately 80% silicon, and may be doped with p-type dopants such as boron in concentrations ranging from approximately $1 \times 10^{20}$ atoms/cm$^3$ to approximately $2 \times 10^{21}$ atoms/cm$^3$.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Still referring to FIGS. 1A-1C, an inter layer dielectric 160 (hereinafter "ILD 160") may be deposited above the source/drain epitaxy 150. The ILD 160 may include any suitable dielectric material, for example, silicon oxide, silicon nitride, hydrogenated silicon carbon oxide , silicon based low-k dielectrics, or porous dielectrics. Known suitable deposition techniques, such as, for example, atomic layer deposition (ALD), chemical vapor deposition (CVD), plasma enhanced chemical vapor deposition, spin on deposition, or physical vapor deposition (PVD) may be used to form the ILD 160. The ILD 160 may each have a thickness ranging from approximately 100 nm to approximately 150 nm and ranges there between.

Figure 2A:
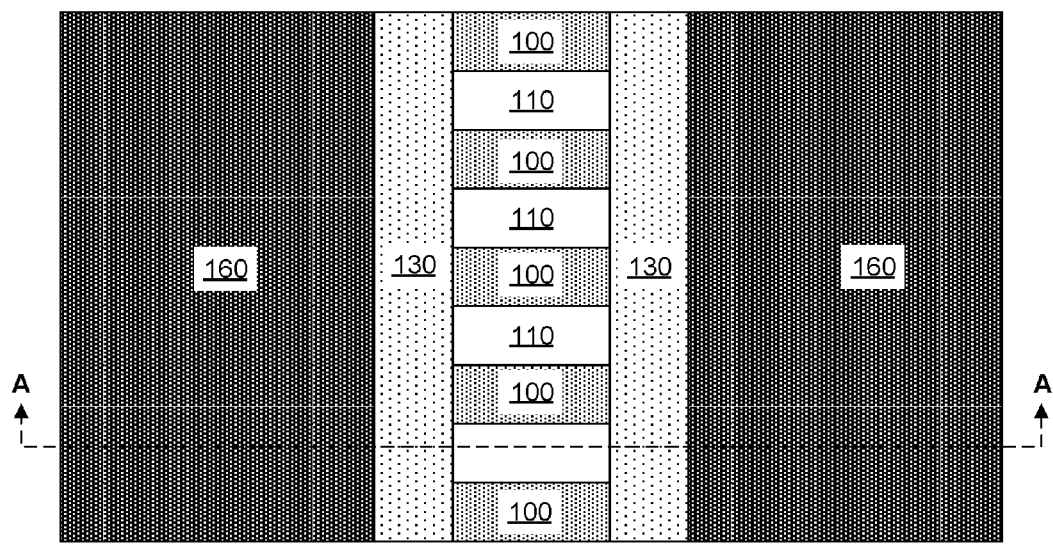
FIG. 2a is a top view of a FinFET device after removing the dummy gate, according to an example embodiment.
Figure 2B:
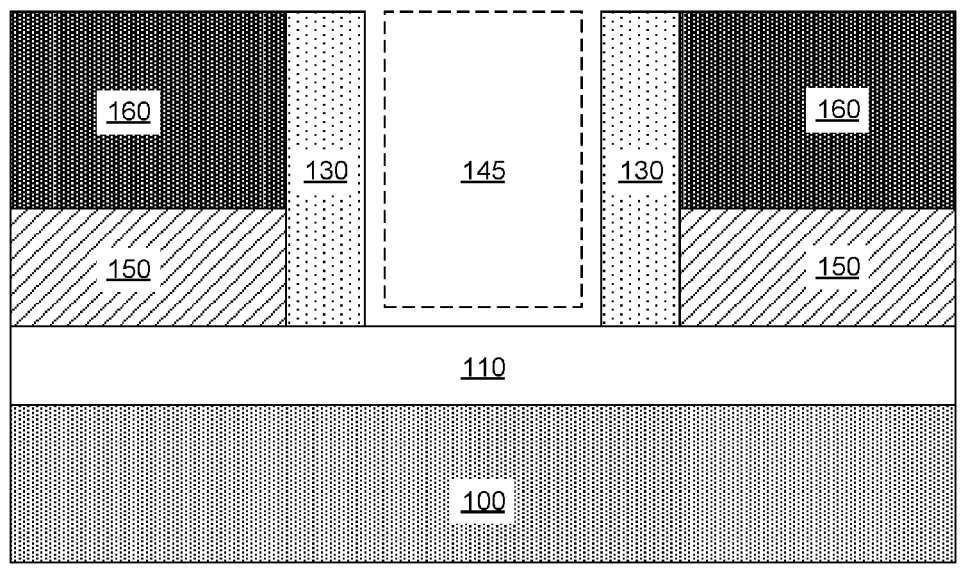
FIG. 2b is a cross sectional view along a-a of FIG. 2a of a FinFET device after removing the dummy gate, according to an example embodiment.
Figure 3A:
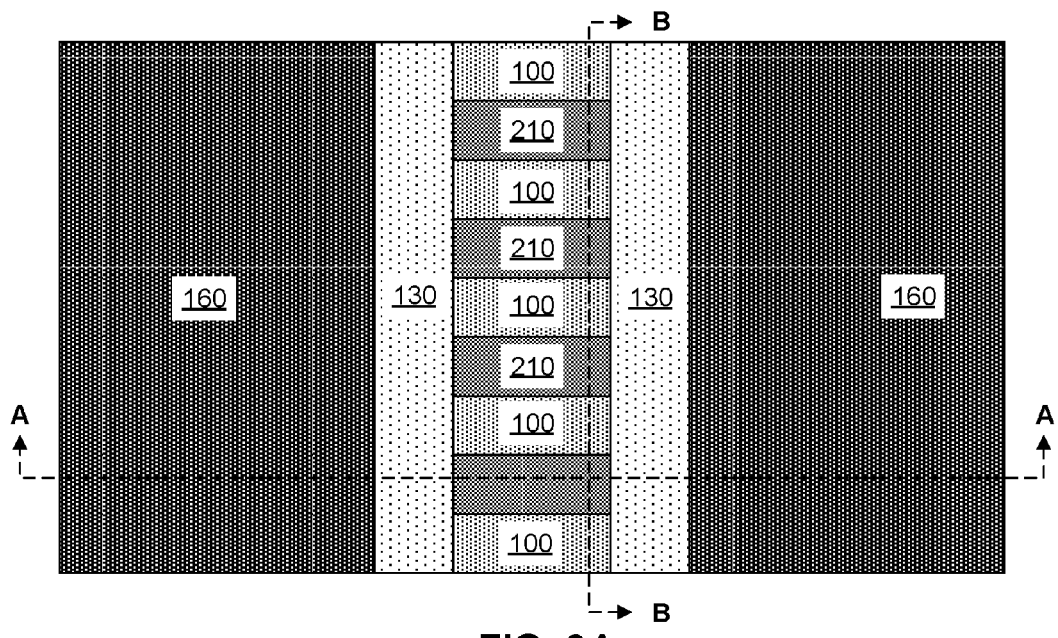
FIG. 3a is a top view of a FinFET device following thermal condensation of the exposed fin, according to an example embodiment.
Figure 3B:
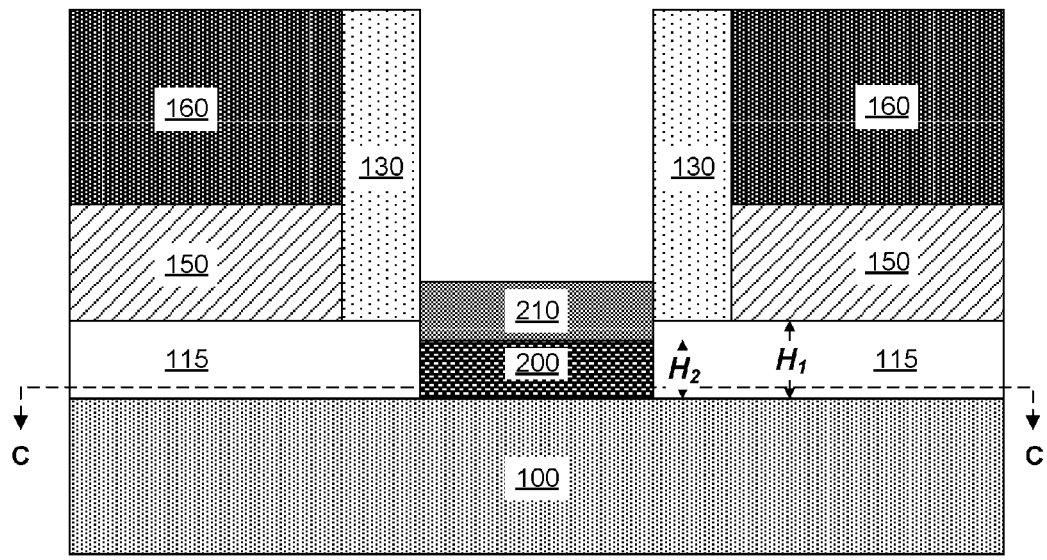
FIG. 3b is a cross sectional view along a-a of FIG. 3a of a FinFET device following thermal condensation of the exposed fin, according to an example embodiment.
Figure 3C:
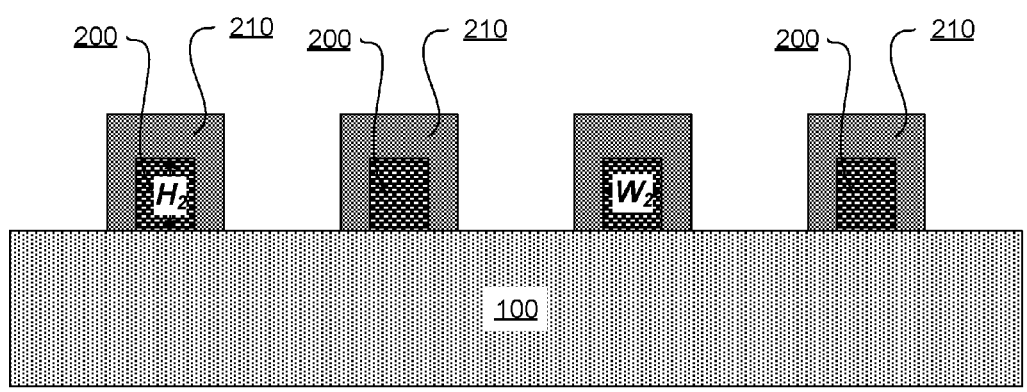
FIG. 3c is a cross sectional view along b-b of FIG. 3a of a FinFET device following thermal condensation of the exposed fin, according to an example embodiment.
Figure 3D:
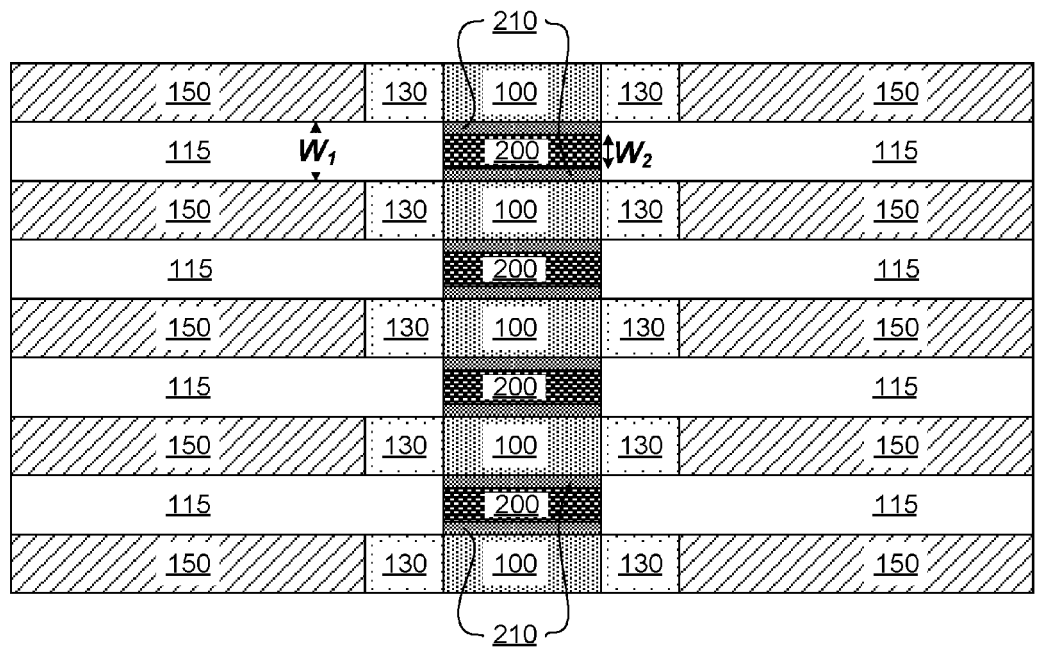
FIG. 3d is a cross sectional view along c-c of FIG. 3b of a FinFET device following thermal condensation of the exposed fin, according to an example embodiment.
Figure 4A:
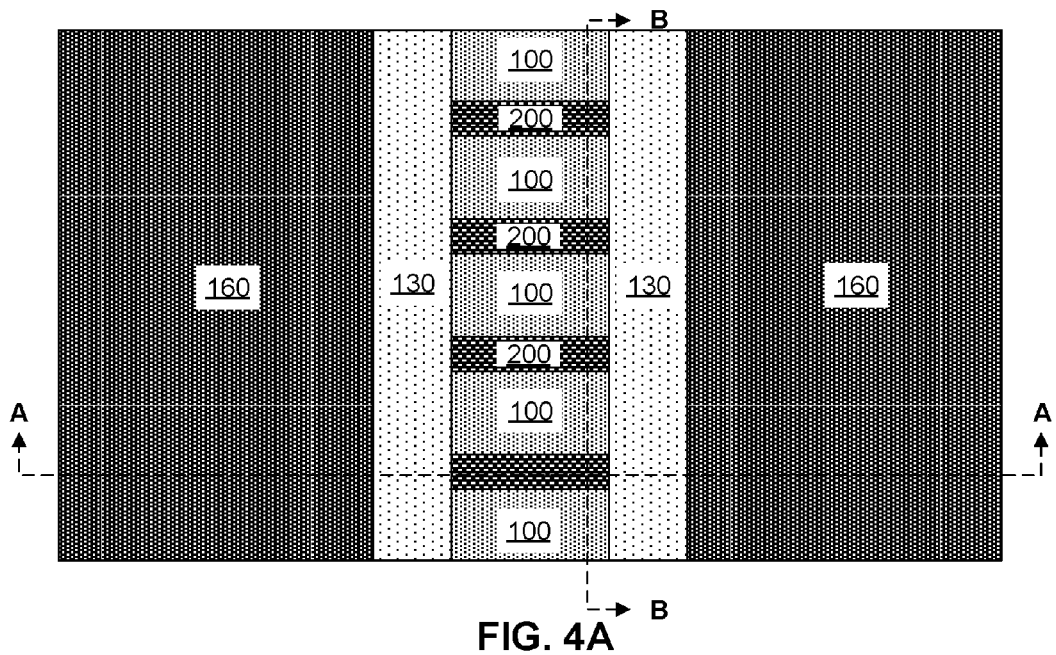
FIG. 4a is a top view of a FinFET device following the removal of the silicon oxide layer formed by thermal condensation, according to an example embodiment.
Figure 4B:
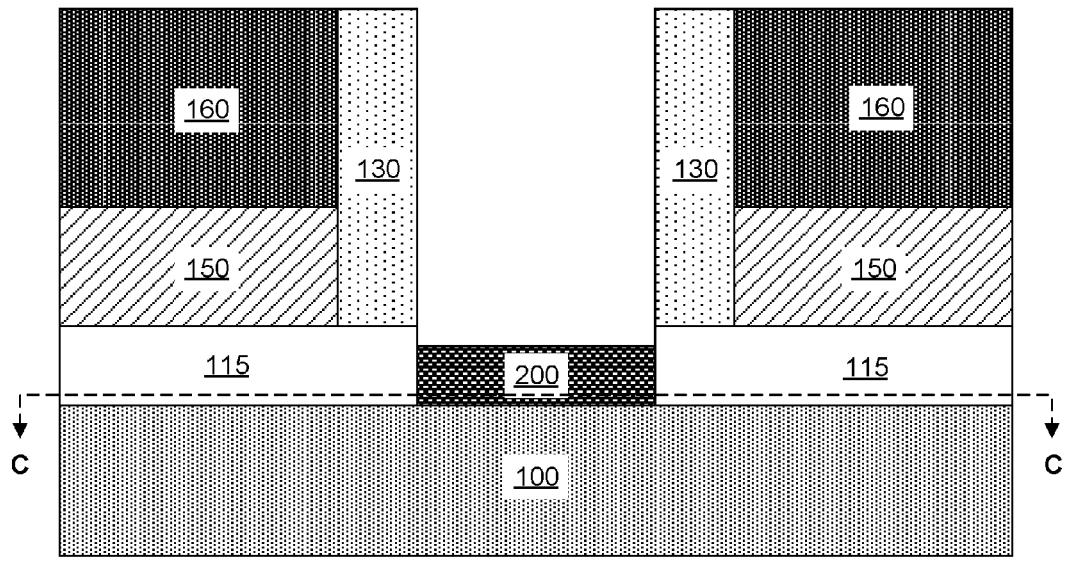
FIG. 4b is a cross sectional view along a-a of FIG. 4a of a FinFET device following the removal of the silicon oxide layer formed by thermal condensation, according to an example embodiment.
Figure 4C:
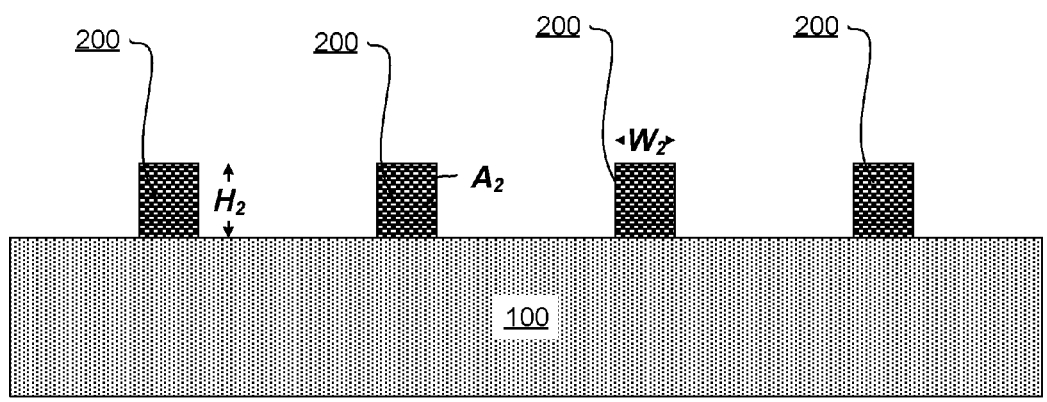
FIG. 4c is a cross sectional view along b-b of FIG. 4a of a FinFET device following the removal of the silicon oxide layer formed by thermal condensation, according to an example embodiment.
Figure 4D:
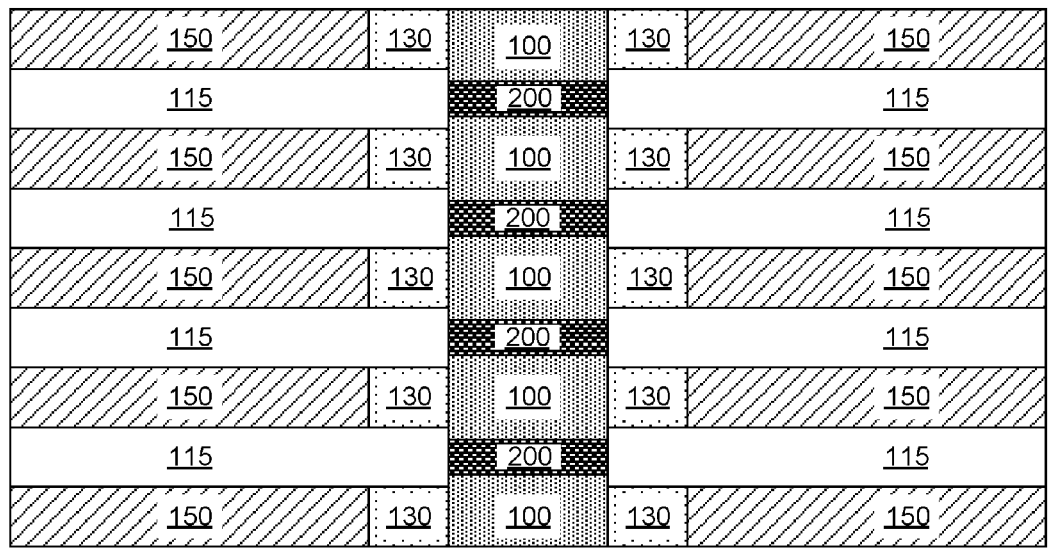
FIG. 4d is a cross sectional view along c-c of FIG. 4b of a FinFET device following the removal of the silicon oxide layer formed by thermal condensation, according to an example embodiment.

Referring to FIGS. 2A-2B, the sacrificial gate structure 140 may be removed, creating a gate void 145. The gate void may be defined as the empty space between spacers 130, and above the substrate 100 and the fin 110. The sacrificial gate structure 140 may be removed by selectively etching the dummy gate using an isotropic or an anisotropic etching process such as, for example, reactive ion etching (RIE), wet etching or plasma etching (not shown). The chemicals and processes selected for the etch should be selected such that the dummy gate is removed, while the spacer 130, ILD 160 and fin 110 remain substantially unaffected.

Referring to FIGS. 3A-3D, thermal condensation of the exposed fin 110 may be performed. The thermal condensation includes oxidation of an outer region of the fin 110 in the channel region, which may cause germanium to migrate toward the center of the fin 110, forming a germanium enriched channel region 200 and an oxidized channel region 210. The thermal condensation process selectively oxidizes the silicon of the silicon germanium fin to silicon oxide, driving the germanium towards the inner part of the fin, and subsequently increasing the concentration of germanium in the non-oxidized portions of the fin 110. Conversely, the migration/diffusion of germanium out of the oxidized region causes silicon to migrate/diffuse into the oxidized region during condensation, further increasing the germanium concentration in 210. Following thermal condensation, the enriched channel region 200 has a chemical formula of $Si_{1-y}Ge_y$, whereby the concentration of germanium, y, may be from about 0.9 to about 1.

Additionally, during thermal condensation, dopants located in the source/drain epitaxy 150 may migrate into the fin 110, creating a doped source/drain region 115. The dopant migration may be impeded by the high concentration of germanium in the germanium enriched channel region 200, and thus may not be present in the germanium enriched channel region 200. Thus, an abrupt junction may be formed between the doped source/drain region 115 and the germanium enriched channel region 200 due to the diffusion of dopants from the source/drain epitaxy 150, and the thermal condensation process. In a preferred embodiment, the doped source/drain region 115 may contain dopants such as boron in concentrations ranging from approximately $1 \times 10^{20}$ atoms/cm$^3$ to approximately $1 \times 10^{21}$ atoms/cm$^3$.

Following the thermal condensation, the germanium enriched channel region has a resulting height, $H_2$, width, $W_2$, and cross-sectional area, $A_2$, which are all less than the height, $H_1$, width, $W_1$, and cross-sectional area, $A_1$, of the fin 110 and doped source/drain region 115. In an example embodiment, thermal condensation may be performed in order to create a germanium enriched channel region 200 containing pure, or substantially pure, germanium. The terms pure and substantially pure refer to a content of at least 90 mole % germanium, more preferably at least 95 mole % germanium.

By "germanium enriched" it is meant a semiconductor material in which germanium is present in a higher concentration than the original silicon germanium fin (i.e. y>x). In some embodiments, the diffusion of germanium creates a germanium enriched channel region 200 in which the germanium is pure, or substantially pure. This may be the result of migration of the germanium atoms to the center of the fin 110.

The thermal condensation of the present application is a thermal oxidation process that is performed at temperature sufficient enough to oxidize the external region of the fin 11 and cause diffusion of germanium to the germanium enriched channel region 200 from the oxidized channel region 210. In one embodiment of the present application, the thermal condensation is performed at a temperature from 700° C. to 1300° C. In another embodiment of the present application, the thermal condensation is performed at a temperature from 900° C. to 1200° C.

Moreover, the thermal condensation of the present application is performed in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The thermal condensation process of the present application may be carried out for a variable period of time. In one example, the thermal condensation process is carried out for a time period from 5 seconds to about 5 hours, depending on thermal oxidation temperature and oxidation species. In another embodiment, the thermal condensation process may be carried out for a time period from 5 minutes to about 30 minutes. The thermal condensation process of the present application may be carried out at a single targeted temperature, or various ramp and soak cycles using various ramp rates and soak times can be employed.

Referring to FIGS. 4A-4D, the oxidized channel region 210 may be removed, leaving the germanium enriched channel region 200 as the contact between the doped source/drain region 115 on either side of the gate structure. Removal of the oxidized channel region 210 may be performed by selectively etching the oxidized channel region 210, while maintaining the germanium enriched channel region 200. This may be performed using etching techniques known in the art such as, for example, RIE, wet etching or plasma etching.

Following the removal of the oxidized channel region 210, the structure that results may be a fin having a channel region, with a source/drain region on located on each side of the channel region. In some embodiments, more than 1 channel region, and more than 2 source/drain regions, may be contained on a single fin. The channel region may be a germanium enriched channel region 200, where the concentration of germanium in the channel region is higher than the concentration of germanium located in the original silicon germanium fin 110, and/or the doped source/drain region 115. The doped source/drain region 115 may contain dopants that migrate from the source/drain epitaxy 150 during the thermal condensation process, thereby increasing the concentration of the dopants as compared to the original silicon germanium fin 110. Additionally, the resulting germanium enriched channel region 200 may have a smaller cross-sectional area $A_2$ than the cross-sectional area $A_1$ of the original fin 110, or the doped source/drain region 115. This may be due to thermal condensation concentrating the germanium of the original fin 110 into the center of the fin, and then removing the unwanted silicon oxide of the oxidized channel region, during the formation of the enriched silicon germanium channel region.

Figure 5:
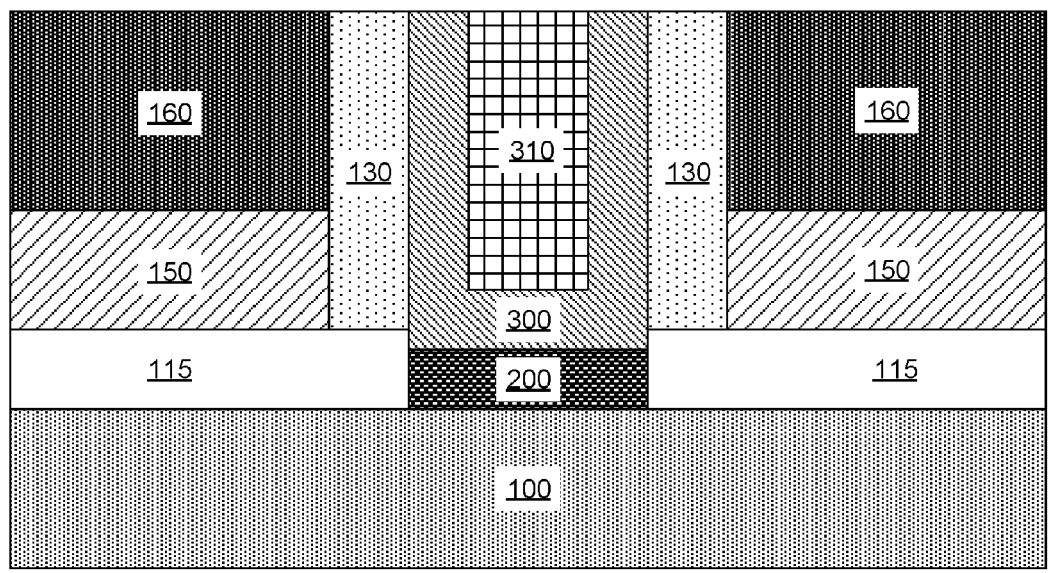
FIG. 5 is a cross sectional view of a FinFET device following deposition of a replacement metal gate, according to an exemplary embodiment.

Referring to FIG. 5 a replacement metal gate (i.e. a replacement gate dielectric 300 and a replacement gate electrode 310) may be created in the gate void 145. The replacement gate dielectric 300 may be deposited first. In one embodiment, the replacement gate dielectric 300 may include silicon oxide ($Si_xO_y$) or a high-k oxide such as, for example, hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The replacement gate dielectric 300 may be deposited over the fin 110 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following the deposition of the replacement gate dielectric 300, in some embodiments a work function metal layer may be deposited. The work function metal layer may include, for example, aluminum, lanthanum oxide, magnesium oxide, strontium titanate, strontium oxide, TiN, TaN. The work function metal layer may be formed using any suitable metal deposition technique, including, for example, CVD, PVD, and ALD, sputtering, and plating.

In some embodiments, a high temperature anneal may be performed prior to the deposition of the gate electrode. The high temperature anneal may be performed in order to increase the performance of the replacement metal gate stack. The high temperature anneal may be performed at temperatures ranging from approximately 600° Celsius to approximately 1250° Celsius and may be annealed for approximately 0.1 to approximately 30 second. In some embodiments, the annealing temperature may be substantially uniform throughout the annealing period, however in other embodiments the annealing period include one or more ramping cycles where the temperature is decreased or increased. Following the anneal, additional work function metal layers, dielectric layer or any other layers known in the art may be deposited.

A replacement gate electrode 310 may be deposited above the replacement gate dielectric 300 or work function layer. The replacement gate electrode 310 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The replacement gate electrode 310 may be formed using any suitable metal deposition technique, including, for example, CVD, PVD, and ALD, sputtering, and plating.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method for forming a finFET comprising:
    forming a finFET structure, wherein the finFET structure comprises a silicon germanium fin having a source/drain region and a channel region, an epitaxial layer located on the source/drain region of the silicon germanium fin, a dummy gate located above the channel region of the silicon germanium fin, and a spacer located between the dummy gate and the epitaxial layer and above the source/drain region of the fin;
    removing the dummy gate;
    performing thermal condensation on an exterior portion of the silicon germanium fin in the channel region, wherein thermal condensation forms a silicon oxide layer on the exterior portion of the silicon germanium fin in the channel region;
    removing the silicon oxide layer from the exterior portion of the silicon germanium fin;
    depositing a dielectric layer surrounding the channel region of the fin, wherein a first portion of a vertical surface of the dielectric layer is in direct contact with the spacer layer and above the channel region of the fin, wherein a second portion of the vertical surface of the dielectric layer is in direct contact with the source/drain region of the fin, and wherein a horizontal surface of the dielectric layer is in direct contact with the entire channel region.

2. The method of claim 1, wherein the concentration of germanium in the enriched germanium fin is greater than 90 mole %.

3. The method of claim 1, wherein the epitaxial layer comprises boron.

4. The method of claim 1, wherein performing thermal condensation causes boron to diffuse into the silicon germanium fin in the source/drain region.

5. The method of claim 4, wherein the diffusion of boron is restricted by the enriched germanium fin in the channel region.

6. The method of claim 1, wherein performing thermal condensation comprises performing a thermal anneal on the silicon germanium fin in the channel region at a temperature of 700° C. to 1300° C.

7. The method of claim 1, wherein performing thermal condensation comprises performing a thermal anneal on the silicon germanium fin in the channel region in the presence of an oxygen containing compound.

8. A method for forming a finFET comprising:
   forming a finFET structure, wherein the finFET structure comprises a silicon germanium fin having a source/drain region and a channel region, an epitaxial layer located on the source/drain region of the silicon germanium fin, a dummy gate located above the channel region of the silicon germanium fin, and a spacer located between the dummy gate and the epitaxial layer and above the source/drain region of the fin;
   removing the dummy gate;
   performing thermal condensation on an exterior portion of the silicon germanium fin in the channel region, wherein thermal condensation causes a cross-sectional area of the fin in the channel region to be less than a cross-sectional area of the fin in the source/drain region;
   depositing a dielectric layer surrounding the channel region of the fin, wherein a first portion of a vertical surface of the dielectric layer is in direct contact with the spacer layer and above the channel region of the fin, wherein a second portion of the vertical surface of the dielectric layer is in direct contact with the source/drain region of the fin, and wherein a horizontal surface of the dielectric layer is in direct contact with the entire channel region.

9. The method of claim 8, wherein the concentration of germanium in the enriched germanium fin is greater than 90 mole %.

10. The method of claim 8, wherein the epitaxial layer comprises boron.

11. The method of claim 10, wherein performing thermal condensation causes boron to diffuse into the silicon germanium fin in the source/drain region.

12. The method of claim 8, wherein performing thermal condensation comprises performing a thermal anneal on the silicon germanium fin in the channel region at a temperature of 700° C. to 1300° C.

13. The method of claim 8, wherein performing thermal condensation comprises performing a thermal anneal on the silicon germanium fin in the channel region in the presence of an oxygen containing compound.

* * * * *